United States Patent
Nagashima et al.

[11] Patent Number: 4,536,464
[45] Date of Patent: Aug. 20, 1985

[54] PHOTOSENSITIVE COMPOSITION WITH O-QUINONEDIAZIDE COMPOUND AND CONDENSATE OF DIHYDRIC PHENOL AND ALDEHYDE OR KETONE

[75] Inventors: Akira Nagashima; Akira Hasegawa, both of Shizuoka; Toshiaki Aoai; Teruo Nagano, both of Kanagawa, all of Japan

[73] Assignee: Fuji Photo Film Company Limited, Igara, Japan

[21] Appl. No.: 550,420

[22] Filed: Nov. 10, 1983

[30] Foreign Application Priority Data

Nov. 10, 1982 [JP] Japan ................. 57-196108

[51] Int. Cl.³ .............. G03C 1/60; G03C 1/54; G03F 7/08
[52] U.S. Cl. .................... 430/192; 430/165; 430/190; 430/193; 430/302; 430/326
[58] Field of Search ............. 430/192, 190, 193, 302, 430/326, 165

[56] References Cited

U.S. PATENT DOCUMENTS

| | | | |
|---|---|---|---|
| 3,647,443 | 3/1972 | Rauner et al. | 430/190 |
| 4,115,128 | 9/1978 | Kita | 430/191 |
| 4,123,279 | 10/1978 | Kobayashi | 430/302 |
| 4,347,305 | 8/1982 | Shiba et al. | 430/156 |

FOREIGN PATENT DOCUMENTS

54258 6/1982 European Pat. Off. ............ 430/192

Primary Examiner—Charles L. Bowers, Jr.

[57] ABSTRACT

The photosensitive composition suitable as a posi-posi photosensitive composition for photosensitive lithographic printing plates is composed of a high molecular compound shown by following general formula I or II and an o-naphthoquinonediazide compound;

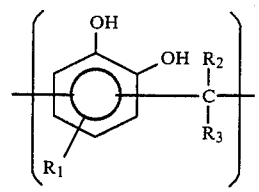

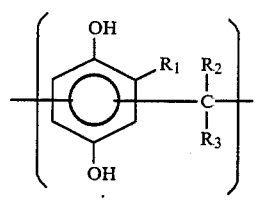

wherein $R_1$ is a hydrogen atom, an alkyl group having 1 to 8 carbon atoms and $R_2$ and $R_3$ each is a hydrogen atom or an alkyl group having 1 to 4 carbon atoms.

When the photosensitive composition is used as a photosensitive layer of a photosensitive lithographic printing plate and the plate is developed by rubbing with a sponge containing a developer, the photosensitive composition at the exposed areas is completely removed leaving no patches of the composition.

7 Claims, No Drawings

PHOTOSENSITIVE COMPOSITION WITH O-QUINONEDIAZIDE COMPOUND AND CONDENSATE OF DIHYDRIC PHENOL AND ALDEHYDE OR KETONE

FIELD OF THE INVENTION

This invention relates to a photosensitive composition suitable for producing photosensitive lithographic printing plates, IC circuits, and photomasks. More particularly, the invention relates to a photosensitive composition composed of an o-naphthoquinonediazide compound and an alkali-soluble high molecular compound.

BACKGROUND OF THE INVENTION

A photosensitive composition composed of an o-naphthoquinonediazide compound as a photosensitive compound and novolak-type phenol resins as a binder are industrially used as excellent photosensitive compositions for producing photosensitive lithographic printing plates and photoresists. Phenols used as the raw materials for such novolak-type phenol resins include phenol, o-cresol, m-cresol, p-cresol and xylenol. Since the foregoing phenols are monohydric phenols, the photosensitive compositions require a relatively strong alkaline developer for developing the composition. However, the development by a strong alkaline developer is accompanied by disadvantages with respect to water pollution and costs. Accordingly, photosensitive compositions which can be developed by a weak alkaline developer have been desired.

When coating a photosensitive composition on a support and using it as a photosensitive lithographic printing plate, it is required that a binder used for forming the photosensitive layer of the photosensitive composition be rich in film-forming property for enduring the application of a large number of printing. Japanese Patent Application (OPI) Nos. 101,833/'82 and 101,834/'82, (European Pat. No. 54,258), disclose photosensitive compositions using the condensation products of resorcin derivatives and aldehydes or ketones as the binder and the photosensitive compositions using the aforesaid binder can be developed by a weak-alkaline developer different from photosensitive compositions using cresol-formaldehyde resin, etc., as the binder as well as have a good film-forming property as compared to the latter composition. However, when the foregoing photosensitive composition is coated on an anodically oxidized aluminum support and the plate thus produced is rubbed with a sponge, etc., impregnated with a developer for the development, a part of the photosensitive composition remains on the support at non-image portions after development, which provides an undesirable appearance as well as frequently causes stains on prints when using the developed plate as a lithographic printing plate.

SUMMARY OF THE INVENTION

An object of this invention is, therefore, to provide a photosensitive composition which can be developed by a developer having a relatively weak alkalinity.

Another object of this invention is to provide a photosensitive composition having a good film-forming property and being suitable for making photosensitive lithographic printing plates.

Still another object of this invention is to provide a photosensitive composition which does not leave a part of it at non-image portions when a photosensitive lithographic printing plate produced by using the photosensitive composition as the photosensitive layer is rubbed for development by a sponge, etc., impregnated with a developer.

As the result of various investigations for attaining the above-described objects of this invention, the inventors have discovered that the foregoing objects can be attained by a photosensitive composition comprising a high molecular compound having the structure shown by following general formula I or II and an o-naphthoquinonediazide compound as a photosensitive compound;

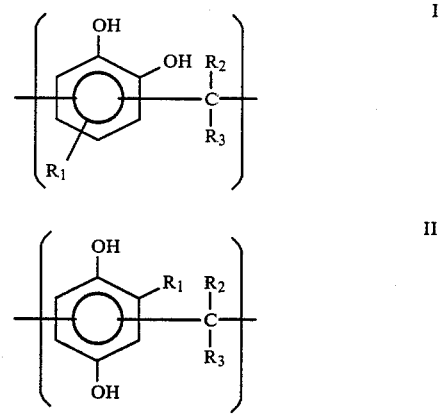

wherein $R_1$ represents a hydrogen atom, an alkyl group having 1 to 8 carbon atoms, or a cycloalkyl group having 3 to 8 carbon atoms and $R_2$ and $R_3$ each represent a hydrogen atom or an alkyl group having 1 to 4 carbon atoms.

DESCRIPTION OF THE PREFERRED EMBODIMENT

As described above, $R_1$ of the high molecular compound shown by general formula I or II is a hydrogen atom, an alkyl group having 1 to 8 carbon atoms or a cycloalkyl group having 3 to 8 carbon atoms and is preferably an ethyl group, a n-propyl group, a n-butyl group, a t-butyl group, or a n-pentyl group. Also, $R_2$ and $R_3$ each is a hydrogen atom or an alkyl group having 1 to 4 carbon atoms. $R_2$ is preferably a hydrogen atom and $R_3$ is preferably a methyl group or an ethyl group.

The suitable molecular weight of the high molecular compound shown by general formula I or II effectively used in this invention for attaining the objects of this invention is about 500 to 10,000, preferably about 800 to 4,000.

High molecular compounds shown by general formula I or II used in this invention are prepared as follows. The desired high molecular compounds can be obtained by condensing a polyhydric phenol as a catechol (when producing the compound shown by general formula I) such as catechol, 4-ethylcatechol, 4-t-butylcatechol, etc., or a hydroquinone (when producing the compound shown by general formula II) such as hydroquinone, 2-n-propylhydroquinone, etc., with an aldehyde or a ketone such as formaldehyde, acetoaldehyde, acetone, methyl ethyl ketone, etc., solely or in the state of the solution thereof in a solvent such as an alcohol, dioxane, etc., in an amount of 0.85 to 1.0 mol per mol of the polyhydric phenol using an alkali such as sodium hydroxide, aqueous ammonia, etc., or an acid such as hydrochloric acid, oxalic acid, etc., as a catalyst. Various combinations of the polyhydric phenols and the aldehydes or ketones may be desirably used. Further two or more kinds of the polyhydric phenols or the aldehydes or ketones may be used for producing the high molecular weight compounds.

Synthesis examples of the high molecular compounds shown by general formulae I and II used in this invention are shown below.

SYNTHESIS EXAMPLE 1

In 500 ml of 1,4-dioxane was dissolved 332 g of 4-t-butylcatechol and then 162 g of 37% formalin was added to the solution with stirring. Furthermore, 1 ml of 5N hydrochloric acid was added to the solution as a catalyst and the mixture was mildly refluxed in order to avoid the occurrence of bumping. After 5 hours, the reaction mixture was poured into 3 liters of cold water and a light yellow resin thus deposited was collected by filtration and dried to provide 302 g of the resin. The molecular weight of the resin measured by a light scattering method was about 2200.

SYNTHESIS EXAMPLE 2

In 500 ml of 1,4-dioxane was dissolved 332 g of 4-t-butylcatechol and then 88 g of acetoaldehyde was added to the solution with stirring. Furthermore, 1 ml of 5N hydrochloric acid was added to the solution as a catalyst and the mixture was mildly refluxed in order to avoid the occurrence of bumping. After 5 hours, the reaction mixture was poured into 3 liters of cold water and a light yellow resin thus deposited was collected by filtration and dried to provide 298 g of the resin. The molecular weight of the resin measured by a light scattering method was about 1800.

SYNTHESIS EXAMPLE 3

In 500 ml of 1,4-dioxane was dissolved 332 g of 2-t-butylhydroquinone and 162 g of 37% formalin was added to the solution with stirring. Furthermore, 1 ml of 5N hydrochloric acid was added to the solution as a catalyst and the mixture was mildly refluxed in order to avoid the occurrence of bumping. After 5 hours, the reaction mixture was poured into 3 liters of cold water and a light yellow resin thus deposited was collected by filtration and dried to provide 276 g of the resin. The molecular weight of the resin measured by a light scattering method was about 1600.

The proportion of the high molecular compound shown by general formula I or II in the photosensitive compositions of this invention is 2% to 90% by weight, preferably 20% to 70% by weight. The photosensitive composition of this invention may further contain a conventional alkali-soluble high molecular compound such as a phenol-formaldehyde resin, a cresol-formaldehyde resin, a phenol-modified xylene resin, polyhydroxystyrene, halogenated polyhydroxystyrene, etc., as a binder in addition to the high molecular compound shown by general formula I or II. The amount of the conventional alkali-soluble high molecular compound used for the purpose is 0 to 80% by weight, preferably 0 to 50% by weight of the total amount of the alkali-soluble high molecular compound.

As the o-naphthoquinonediazide compound, the ester of 1,2-naphthoquinone-2-diazido-5-sulfonyl chloride and a pyrogallol-acetone resin as described in U.S. Pat. No. 3,635,709 is most preferred. Examples of other suitable known o-naphthoquinonediazide compounds are the esters of 1,2-naphthoquinone-2-diazido-5-sulfonyl chloride and phenol-formaldehyde resins described in U.S. Pat. Nos. 3,046,120 and 3,188,210. Other known o-naphthoquinonediazide compounds used in this invention are described in Japanese Patent Application (OPI) Nos. 63,802/'73; 63,803/'73; 96,575/'73 (corresponding to Canadian Pat. No. 1,008,593); and 38,701/'74; Japanese Patent Publication Nos. 11,222/'66; 9610/'70; and 17,481/'74; U.S. Pat. Nos. 2,797,213; 3,454,400; 3,544,323; 3,573,917; 3,674,495; 3,644,118; 3,711,285 and 3,785,825; British Pat. Nos. 1,227,602; 1,251,345; 1,267,005; 1,329,888; and 1,330,932; and German Pat. No. 854,890.

The amount of the o-naphthoquinonediazide contained in the photosensitive composition of the present invention is 10 to 50% by weight, more preferably 20 to 40% by weight.

The photosensitive compositions of this invention may further contain a cyclic acid anhydride for increasing the sensitivity, a printing out agent for obtaining a visible image directly after exposure, a dye as an image coloring agent, and other fillers. Examples of the cyclic acid anhydride are phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, $\alpha$-phenylmaleic anhydride, succinic anhydride, pyromellitic anhydride, etc. as described in U.S. Pat. No. 4,115,128. By incorporating the cyclic acid anhydride in the photosensitive composition in an amount of 1 to 15% by weight of the total amount of the composition, the sensitivity thereof can be increased at most about 3 times the original sensitivity. As the printing out agent for obtaining a visible image directly after light exposure, there is a combination of a photosensitive compound capable of releasing an acid by light exposure and an organic dye capable of forming a salt. Practical examples are the combination of o-naphthoquinonediazido-4-sulfonic acid halogenide and a salt-forming organic dye described in Japanese Patent Application (OPI) No. 8128/'78, U.S. Pat. No. 3,969,118 and a combination of a trihalomethyl compound and a salt-forming organic dye described in U.S. Pat. Nos. 4,160,671 and 4,212,970. As the coloring agent, other dyes than the foregoing salt-forming organic dyes can be also used. As the preferred dyes including the salt-forming organic dyes, there are illustrated oil-soluble dyes and basic dyes. Practical examples of these dyes are Oil Yellow #101, Oil Yellow #130, Oil Pink #312, Oil Green BG, Oil Blue BOS, Oil Blue #603, Oil Black BY, Oil Black BS, Oil Black T-505 (the above dyes are trade names, made by Orient Kagaku Kogyo K.K.), Crystal Violet (CI 42555), Methyl Violet (CI 42535), Rhodamine B (CI 45170B), Malachite Green (CI 42000), Methylene Blue (CI 52015), etc.

The photosensitive composition of this invention is coated on a support as a solution in a solvent dissolving the foregoing components. As the solvent used for the purpose, there are, for example, ethylene dichloride, cyclohexanone, methyl ethyl ketone, ethylene glycol monomethyl ether, ethylene glycol monoethyl ether, 2-methoxyethyl acetate, toluene, ethyl acetate, etc., and these solvents may be used solely or as a mixture of them. Also, the concentration (as solid content) of the foregoing components in the solution of the photosensitive composition of this invention is 2 to 50% by weight. The coating amount (coverage) of the coating liquid depends upon the use of the photosensitive compositon but generally is preferably 0.5 to 3.0 g/m² as solid content in the case of using the composition for, for example, a photosensitive lithographic printing plate. With the decrease of the coating amount of the photosensitive composition, the light sensitivity of the photosensitive lithographic printing plate is increased but the mechanical property of the photosensitive layer is reduced.

In the case of producing a photosensitive lithographic printing plate using the photosensitive composition of this invention, the photosensitive composition is coated on a support such as an aluminum plate subjected to a hydrophilic treatment, e.g., an aluminum plate subjected to a silicate treatment, an anodically oxidized aluminum plate, a grained aluminum plate, a silicate-electrodeposited aluminum plate, a zinc plate, a stainless steel plate, a chromed steel plate, a plastic film or paper subjected to a hydrophilic treatment, etc.

As a suitable developer for the photosensitive composition of this invention, there is an aqueous solution of an inorganic alkalifying agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, ammonia (aqueous ammonia), etc. The concentration of the alkalifying agent is ordinary 0.1 to 10% by weight, preferably 0.5 to 5% by weight.

The alkaline aqueous solution may contain, if necessary, a surface active agent and an organic solvent such as an alcohol.

The invention will now be explained in more detail by the following examples. However, the scope of the invention is not limited to these examples. In addition, all percentages in the following examples are, unless otherwise indicated, by weight.

EXAMPLE 1

A 2S aluminum plate of 0.24 mm in thickness was immersed in an aqueous solution of 10% sodium tertiary phosphate maintained at 80° C. for 3 minutes to perform degreasing and after graining the aluminum plate with a nylon brush, the plate was etched for about 10 seconds using a solution of sodium aluminate and subjected to a desmut treatment with an aqueous solution of 3% sodium hydrogensulfate. The aluminum plate was anodically oxidized in an aqueous solution of 20% sulfuric acid for 2 minutes at a current density of 2 amperes/dm² to provide an aluminum plate (I).

The aluminum plate (I) was coated with a photosensitive liquid (A) having the following composition and dried for 2 minutes at 100° C. to provide a photosensitive printing plate (A) of this invention.

| Photosensitive liquid (A): | |
| --- | --- |
| Esterified product of 1,2-naphthoquinone-2-diazido-5-sulfonyl chloride and pyrogallol-acetone resin (described in Example 1 of U.S. Pat. No. 3,635,709) | 0.9 g |
| The compound obtained in Synthesis Example 1 | 1.9 g |
| Phthalic anhydride | 0.2 g |
| 2-(p-Butoxyphenyl)-4,6-bis(trichloromethyl)-s-triazine | 0.01 g |
| 1,2-Naphthoquinone-2-diazido-4-sulfonyl chloride | |
| Oil-soluble dye (CI 42595) | 0.03 g |
| Ethylene dichloride | 15 g |
| Methyl cellosolve | 8 g |

COMPARATIVE EXAMPLE 1

An aluminum plate treated as in the aluminum plate (I) was coated with a photosensitive liquid (B) using a phenol-formaldehyde resin in place of the compound obtained in Synthesis Example 1 to provide a photosensitive lithographic printing plate (B).

Furthermore, an aluminum plate treated in the same manner as aluminum plate (I) was coated with a photosensitive liquid (C) using a 2-methylresorcinacetaldehyde resin (the compound described in Example 1 of Japanese Patent Application (OPI) No. 101,833/'82) in place of the compound obtained in Synthesis Example 1 in the photosensitive liquid (A) by the same manner as when coating the photosensitive liquid (A) to provide a photosensitive lithographic printing plate (C).

The coverage of the coating after drying was 2.2 g/m² for the photosensitive lithographic printing plates (A), (B), and (C).

On the photosensitive layer of each of these photosensitive lithographic printing plate was closely placed a positive transparency having a line image and a dot image and the photosensitive layer was exposed to a carbon arc lamp of 30 amperes at a distance of 70 cm.

Each of the exposed photosensitive lithographic printing plates (A), (B), and (C) was rubbed with a sponge impregnated with an aqueous solution of 1% sodium metasilicate (9 hydrate) for development. In this case the photosensitive lithographic printing plate (A) of this invention could be quickly developed to provide a clean lithographic printing plate leaving almost no photosensitive composition at the non-image portions. On the other hand, the comparison photosensitive lithographic printing plate (B) could not be developed since the exposed non-image portions were not dissolved in the developer and could scarecely be developed by increasing the concentration of sodium metasilicate in the developer to 3%. Also, the comparison photosensitive lithographic printing plate (C) could be quickly developed but a part of the photosensitive composition remained on the non-image portions as patches and the patches could not be removed by developing again.

Each of the developed lithographic printing plates (A) and (C) was printed on an offset printing machine. Clean impressions having no stain were obtained when using the lithographic printing plate (A) but the impressions obtained using the lithographic printing plate (C) were partially stained. The number of impressions obtained was 70,000 in each case.

EXAMPLE 2

An aluminum plate treated in the same manner as aluminum plate (I) in Example 1 was coated with a photosensitive liquid (D) having the following composition by the same manner as when coating the photosensitive composition (A) to provide a photosensitive lithographic printing plate (D) of the invention.

| Photosensitive liquid (D): | |
| --- | --- |
| Esterified compound of 1,2-naphtho-quinone-2-diazido-5-sulfonyl chloride and phenol-formaldehyde resin | 0.8 g |
| The compound obtained in Synthesis Example 3 | 2.0 g |
| Phthalic anhydride | 0.2 g |
| 1,2-naphthoquinone-2-diazido-4-sulfonyl chloride | 0.03 g |
| Oil-soluble dye (CI 42595) | 0.04 g |
| Ethylene dichloride | 15 g |
| Methylcellosolve | 8 g |

COMPARATIVE EXAMPLE 2

A photosensitive liquid (E) was prepared according to the preparation of the photosensitive liquid (D) using a resorcin-benzaldehyde resin (the compound described in Example 1 of Japanese Patent Application (OPI) No. 101,834/'82) instead of the compound obtained in Synthesis Example 3. Then, an aluminum plate was coated with the photosensitive liquid (D) by the same manner as when coating the photosensitive liquid (A) to provide a photosensitive lithographic plate (E). Also, an aluminum plate as above described was coated with a photosensitive liquid (F) using a cresol-formaldehyde resin in place of the compound obtained in Synthesis Example 1 in the photosensitive liquid (D) by the same manner as when coating the photosensitive liquid (A) to provide a photosensitive lithographic printing plate (F).

The coverage of the coating after drying was 2.5 g/m² for the photosensitive lithographic printing plates (D), (E), and (F).

On the photosensitive layer of each of the photosensitive lithographic printing plates (D), (E), and (F) was closely placed a positive transparency having a line image and a dot image and the photosensitive layer was exposed to a carbon arc lamp of 30 amperes at a distance of 70 cm.

Each of the exposed photosensitive lithographic printing plates (D), (E), and (F) was rubbed by a sponge impregnated with an aqueous solution of 1% sodium metasilicate (9-hydrate) for development. In this case the photosensitive lithographic printing plate (D) of this invention could be quickly developed to provide a clean lithographic printing plate leaving almost no stains at the non-image portions. On the other hand, the comparison photosensitive lithographic plate (E) could be quickly developed but a part of the photosensitive composition remained on the non-image portions as patches and the patches were not removed by developing again. Also, the comparison photosensitive lithographic printing plate (F) could not be developed since the photosensitive composition at the exposed non-image portions was not dissolved in the developer but could scarecely be developed by increasing the concentration of sodium metasilicate in the developer to 3%.

Each of the developed lithographic printing plates (D) and (E) was printed on an offset printing machine. Clean impressions having no stains were obtained when using the lithographic printing plate (D) of this invention but the impressions obtained using comparative lithographic printing plate (E) partially stained.

While the invention has been described in detail and with reference to specific embodiment thereof, it will be apparent to one skilled in the art that various changes and modifications can be made therein without departing from the spirit and scope thereof.

What is claimed is:

1. A photosensitive composition comprising in admixture, a high molecular compound having the structure shown by following general Formula I or II and an o-naphthoquinonediazide as a photosensitive compound;

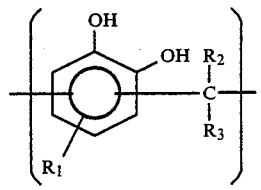

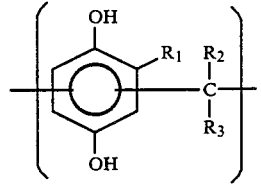

wherein $R_1$ represents an ethyl group, a n-propyl group, a n-butyl group, a t-butyl group or a n-pentyl group and $R_2$ and $R_3$ each represents a hydrogen atom or an alkyl group having 1 to 4 carbon atoms, wherein the proportion of the high molecular compound in the photosensitive composition is 2 to 90% by weight and wherein the o-naphthoquinonediazide compound is present in the composition in an amount in the range of 10% to 50% by weight.

2. The photosensitive composition as claimed in claim 1 wherein the general formulae I and II, $R_1$ is an ethyl group, a n-propyl group, a n-butyl group, a t-butyl group, or a n-pentyl group; $R_2$ is a hydrogen atom; and $R_3$ is a methyl group or an ethyl group.

3. The photosensitive composition as claimed in claim 1 wherein the high molecular compound shown by general formula I or II has a molecular weight of about 500 to 10,000.

4. A photosensitive composition as claimed in claim 3, wherein the high molecular compound has a molecuar weight in the range of about 800 to 4,000.

5. A photosensitive composition as claimed in claim 1, wherein the high molecular compound is present in the composition in an amount in the range of 20% to 70% by weight.

6. A photosensitive composition as claimed in claim 1, wherein the o-naphthoquinonediazide is present in the composition in an amount in the range of 20% to 40% by weight.

7. A photosensitive composition as claimed in claim 1, further comprising a binder comprised of conventional alkali-soluble high molecular compounds present in the composition in an amount of 0 to 80% by weight of the total amount of the alkali-soluble high molecular compound.

* * * * *